(12) United States Patent
Lee et al.

(10) Patent No.: US 12,207,429 B2
(45) Date of Patent: Jan. 21, 2025

(54) POWER CONVERSION DEVICE HAVING TEMPERATURE DETERMINATION FUNCTION

(71) Applicant: ELEMENTS PERFORMANCE TECHNOLOGY INC., Kaohsiung (TW)

(72) Inventors: Jerryson Lee, Kaohsiung (TW); Ethan Lee, Kaohsiung (TW); Yu-Jia Huang, Kaohsiung (TW); Kuo-Sung Huang, Kaohsiung (TW)

(73) Assignee: ELEMENTS PERFORMANCE TECHNOLOGY INC., Kaohsiung (TW)

( * ) Notice: Subject to any disclaimer, the term of this patent is extended or adjusted under 35 U.S.C. 154(b) by 231 days.

(21) Appl. No.: 18/109,912

(22) Filed: Feb. 15, 2023

(65) Prior Publication Data
US 2024/0138087 A1 Apr. 25, 2024
US 2024/0237253 A9 Jul. 11, 2024

(30) Foreign Application Priority Data

Oct. 21, 2022 (TW) .................................. 111139966

(51) Int. Cl.
*H05B 45/37* (2020.01)
*H05K 7/14* (2006.01)

(52) U.S. Cl.
CPC ......... *H05K 7/14322* (2022.08); *H05B 45/37* (2020.01)

(58) Field of Classification Search
CPC . G01K 11/06; G01K 3/00; G01K 5/00; G01K 7/00; G01K 9/00; H05K 7/14322; H05B 45/37

USPC .......................................................... 361/752
See application file for complete search history.

(56) References Cited

U.S. PATENT DOCUMENTS

| | | | |
|---|---|---|---|
| 3,630,677 A * | 12/1971 | Angus ..................... | C01B 32/25 |
| | | | 252/502 |
| 9,900,951 B1 * | 2/2018 | Lee ........................ | F21V 29/773 |
| 2012/0098434 A1 * | 4/2012 | Sondericker, III ..... | H05B 45/00 |
| | | | 315/117 |

(Continued)

FOREIGN PATENT DOCUMENTS

| CN | 102032467 A | 4/2011 |
|---|---|---|
| CN | 102362420 A | 2/2012 |

(Continued)

*Primary Examiner* — Timothy J Thompson
*Assistant Examiner* — Michael F McAllister
(74) *Attorney, Agent, or Firm* — Li & Cai Intellectual Property (USA) Office

(57) ABSTRACT

A power conversion device having a temperature determination function is provided. The power conversion device is disposed on a light fixture and includes a housing, a power converter, and at least one temperature determination component. The power converter and the temperature determination component are disposed within the housing, and the temperature determination component is a temperature fuse. When an ambient temperature of the power converter reaches a preset temperature, the temperature determination component melts to indicate that the power converter is used under the abnormal ambient temperature. Accordingly, the ambient temperature of the power converter can be determined to be abnormal.

20 Claims, 8 Drawing Sheets

(56) References Cited

U.S. PATENT DOCUMENTS

2020/0134989 A1  4/2020  Gupta

FOREIGN PATENT DOCUMENTS

| CN | 105406733 A | 3/2016 |
| CN | 206611329 U | 11/2017 |
| CN | 114630565 A | 6/2022 |

* cited by examiner

POWER CONVERSION DEVICE HAVING TEMPERATURE DETERMINATION FUNCTION

CROSS-REFERENCE TO RELATED PATENT APPLICATION

This application claims the benefit of priority to Taiwan Patent Application No. 111139966, filed on Oct. 21, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a power conversion device, and more particularly to a power conversion device having a temperature determination function and being capable of converting an alternating current (AC) to a direct current (DC).

BACKGROUND OF THE DISCLOSURE

Traditionally, light fixtures provide lighting by an incandescent light bulb, a fluorescent lamp, a mercury-vapor light bulb, or a halogen light bulb. In recent years, with the improvement of diode technology, light-emitting diodes (LED) with high power and high luminosity have been put on the market one after another, and have begun replacing other traditional light sources. A diode is driven by a direct current (DC). As such, a conversion circuit is usually installed in an LED light fixture, so as to convert an alternating current (AC) used in everyday life to the direct current (DC) and provide electricity to the LED within the light fixture.

When being used under an abnormal ambient temperature, a conventional power conversion device and the corresponding light fixture are likely to malfunction, thereby causing inconveniences in use.

SUMMARY OF THE DISCLOSURE

In response to the above-referenced technical inadequacy, the present disclosure provides a power conversion device having a temperature determination function, which can determine whether or not a power converter is used under an abnormal ambient temperature. In this way, users can be warned in advance, and operational safety of the power conversion device and a light fixture can be effectively improved.

In one aspect, the present disclosure provides a power conversion device having a temperature determination function, which includes a housing, a power converter, and at least one temperature determination component. An accommodating space is formed inside the housing. The power converter is disposed within the accommodating space of the housing, and the power converter is a power conversion circuit for converting an alternating current to a direct current. The at least one temperature determination component is disposed within the accommodating space of the housing. The at least one temperature determination component has no electrical connection and melts upon reaching a preset temperature. When an ambient temperature of the power converter reaches the preset temperature, the at least one temperature determination component melts to indicate that the ambient temperature of the power converter is abnormal.

In another aspect, the present disclosure provides a power conversion device having a temperature determination function, which includes a housing, a power converter, and at least one temperature determination component. An accommodating space is formed inside the housing. The power converter is disposed within the accommodating space of the housing, and the power converter is a power conversion circuit for converting an alternating current to a direct current. The at least one temperature determination component is disposed within the power converter. The at least one temperature determination component has no electrical connection and melts upon reaching a preset temperature. When an ambient temperature of the power converter reaches the preset temperature, the at least one temperature determination component melts to indicate that the ambient temperature of the power converter is abnormal.

In yet another aspect, the present disclosure provides a power conversion device having a temperature determination function, which includes a power converter and at least one temperature determination component. The power converter is a power conversion circuit for converting an alternating current to a direct current. The at least one temperature determination component is disposed within the power converter. The at least one temperature determination component has no electrical connection and melts upon reaching a preset temperature. When an ambient temperature of the power converter reaches the preset temperature, the at least one temperature determination component melts to indicate that the ambient temperature of the power converter is abnormal.

Therefore, the power conversion device having the temperature determination function provided by the present disclosure includes the power converter and the at least one temperature determination component. When the ambient temperature of the power converter reaches the preset temperature, the at least one temperature determination component melts to indicate that the ambient temperature is abnormal (i.e., the temperature being overly high). As such, whether or not the power converter is used under the abnormal ambient temperature can be determined based on melting of the at least one temperature determination component, so that the users can be warned and operational safety of the power converter and the light fixture can be improved.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
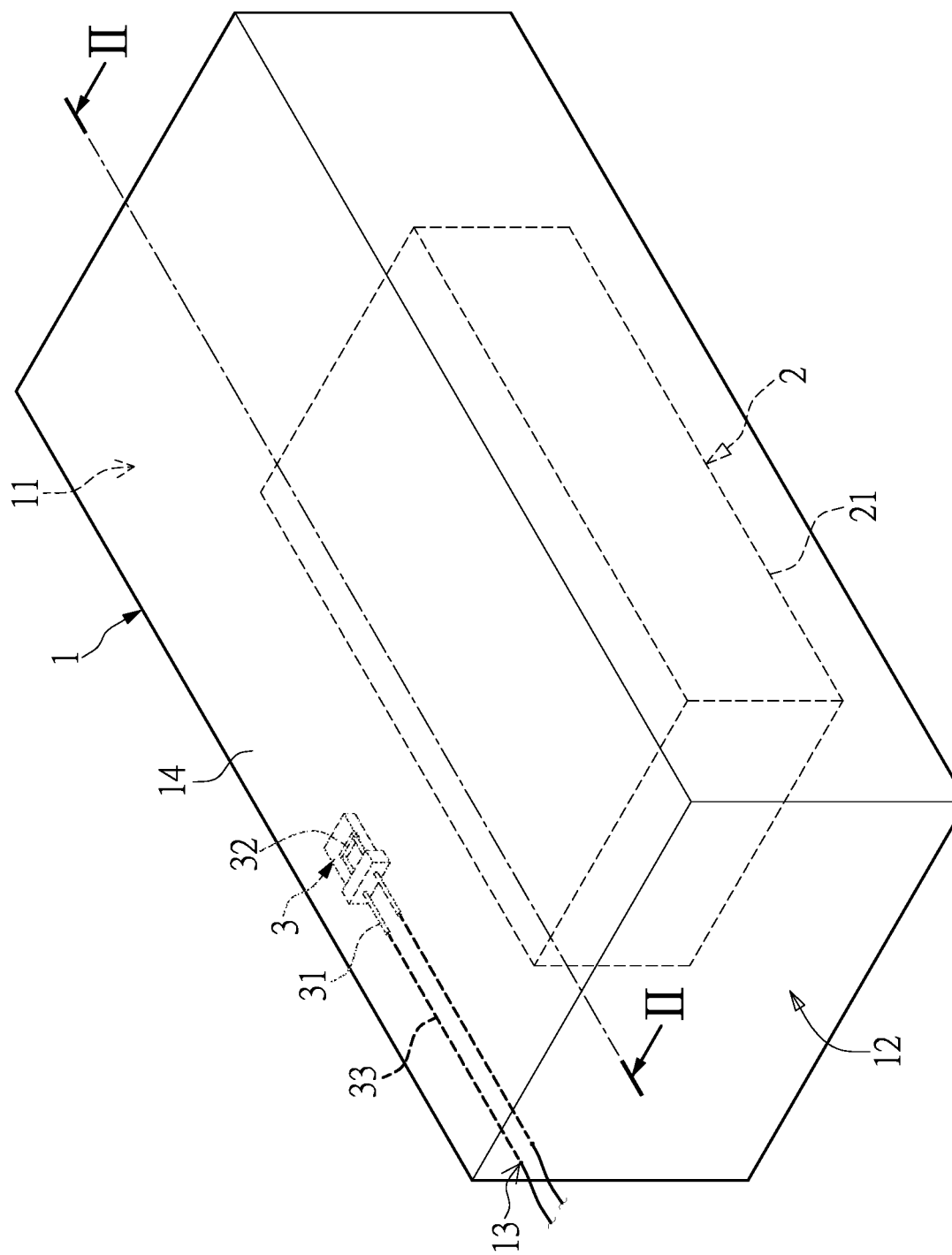
FIG. 1 is a schematic perspective view of a power conversion device having a temperature determination function according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
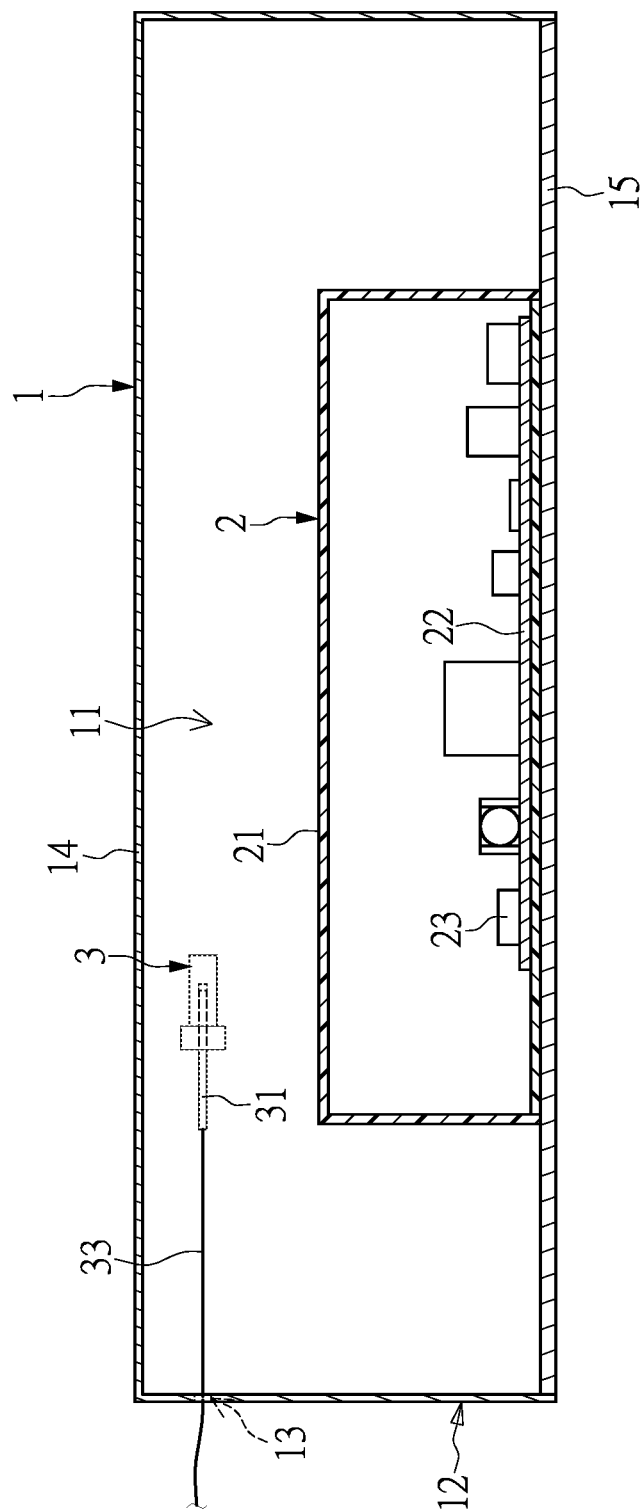
FIG. 2 is a cross-sectional view taken along line II-II of FIG. 1.

Referring to FIG. 1 and FIG. 2, the present disclosure provides a power conversion device having a temperature determination function, which can be applied to devices such as LED light fixtures for converting an alternating current (AC) to a direct current (DC). The power conversion device can perform operations that include rectification and a step-down process on a power source, so as to provide electricity required by the devices such as the LED light fixtures. The power conversion device includes a housing 1, a power converter 2, and at least one temperature determination component 3.

The housing 1 is a hollow body, and is not limited to any specific shape. In the present embodiment, the housing 1 is a square-shaped body, and an accommodating space 11 is formed inside the housing 1. The housing 1 has a side wall 12 at one side thereof. In the present embodiment, the housing 1 includes an upper housing 14 and a lower housing 15, the upper housing 14 is disposed above the lower housing 15, and the accommodating space 11 is defined between the upper housing 14 and the lower housing 15. The upper housing 14 can be connected to the lower housing 15 by threaded engagement, fastening, or other manners of engagement.

The power converter 2 is disposed within the accommodating space 11 of the housing 1. The power converter 2 is a power conversion circuit, and can include electronic components such as a transformer, an inductor, a capacitor, an integrated circuit, and a metal-oxide-semiconductor (MOS) transistor, so that the power converter 2 can convert the alternating current (AC) to the direct current (DC). The technology behind the power converter 2 is known in the related art, and there are no limitations on a circuitry and a structure of the power converter 2 in the present disclosure. Reference is made to FIG. 2. In the present embodiment, the power converter 2 has an outer casing 21, and a substrate 22 is disposed within the outer casing 21. The substrate 22 is a circuit board, and the circuit board can include electronic components 23 such as a transformer, an inductor, a capacitor, an integrated circuit, and a metal-oxide-semiconductor (MOS) transistor, so that the power converter 2 can convert the alternating current (AC) to the direct current (DC).

The temperature determination component 3 is a fuse, and a temperature fuse currently available on the market can be used for the temperature determination component 3. The temperature fuse contains wire-shaped or sheet-shaped materials of terne alloy, zinc, copper, or silver (which have a low melting point). When a temperature is overly high, these low melting point materials will melt due to the high temperature. The temperature determination component 3 is disposed within the accommodating space 11 of the housing 1, and can be adjacent to or distant from the outer casing 21 of the power converter 2. The temperature determination component 3 can be spaced apart from the power converter 2 (the outer casing 21), or can be in contact with the power converter 2 (the outer casing 21).

The temperature determination component 3 can be the temperature fuse, and the temperature fuse has no electrical connection (i.e., having no electrically conductive connection). The temperature fuse will melt upon reaching a preset temperature. The preset temperature ranges between 50° C. and 80° C., and can be 50° C., 55° C., 60° C., 65° C., 70° C., 75° C., or 80° C. Usually, once a temperature of the power converter 2 reaches 50° C., the power converter 2 is likely to be negatively influenced. The higher the temperature rises, the greater the influence is. When the temperature of the power converter 2 reaches over 80° C., the power converter 2 is likely to be damaged. A preferable determination and warning effect can be achieved when the preset temperature of the temperature determination component 3 ranges between 50° C. and 80° C.

In the present embodiment, the temperature determination component 3 has a pin 31, the pin 31 is connected to a connection wire 33, and the connection wire 33 can extend outside of the housing 1 through a through hole 13 on the side wall 12 for convenience of testing. During testing, by opening the housing 1 (the upper housing 14 and the lower housing 15), the temperature determination component 3 can also be accessible without the connection wire 33.

In the present disclosure, no limitation is imposed upon a model and a structure of the temperature determination component 3, and the temperature determination component 3 can be various existing temperature fuses. As shown in FIG. 1, a quantity of the pins 31 of the temperature determination component 3 is two, and a low melting point component 32 is connected between respective ends of the two pins 31. When the temperature determination component 3 reaches the preset temperature, the low melting point component 32 will melt, such that an open circuit is formed between the two pins 31.

When an ambient temperature of the power converter 2 reaches the preset temperature, the temperature determination component 3 melts to indicate that the ambient temperature of the power converter 2 is abnormal. Melting of the temperature determination component 3 can be measured by a multimeter, so as to check whether or not the temperature determination component 3 is melted. If the temperature determination component 3 is melted, it can be known that the ambient temperature of the power converter 2 has reached the preset temperature. In this way, the ambient temperature of the power converter 2 can be monitored, and temperatures experienced by a product can be observed. After melting, the temperature determination component 3 can be replaced.

Second Embodiment

Figure 3:
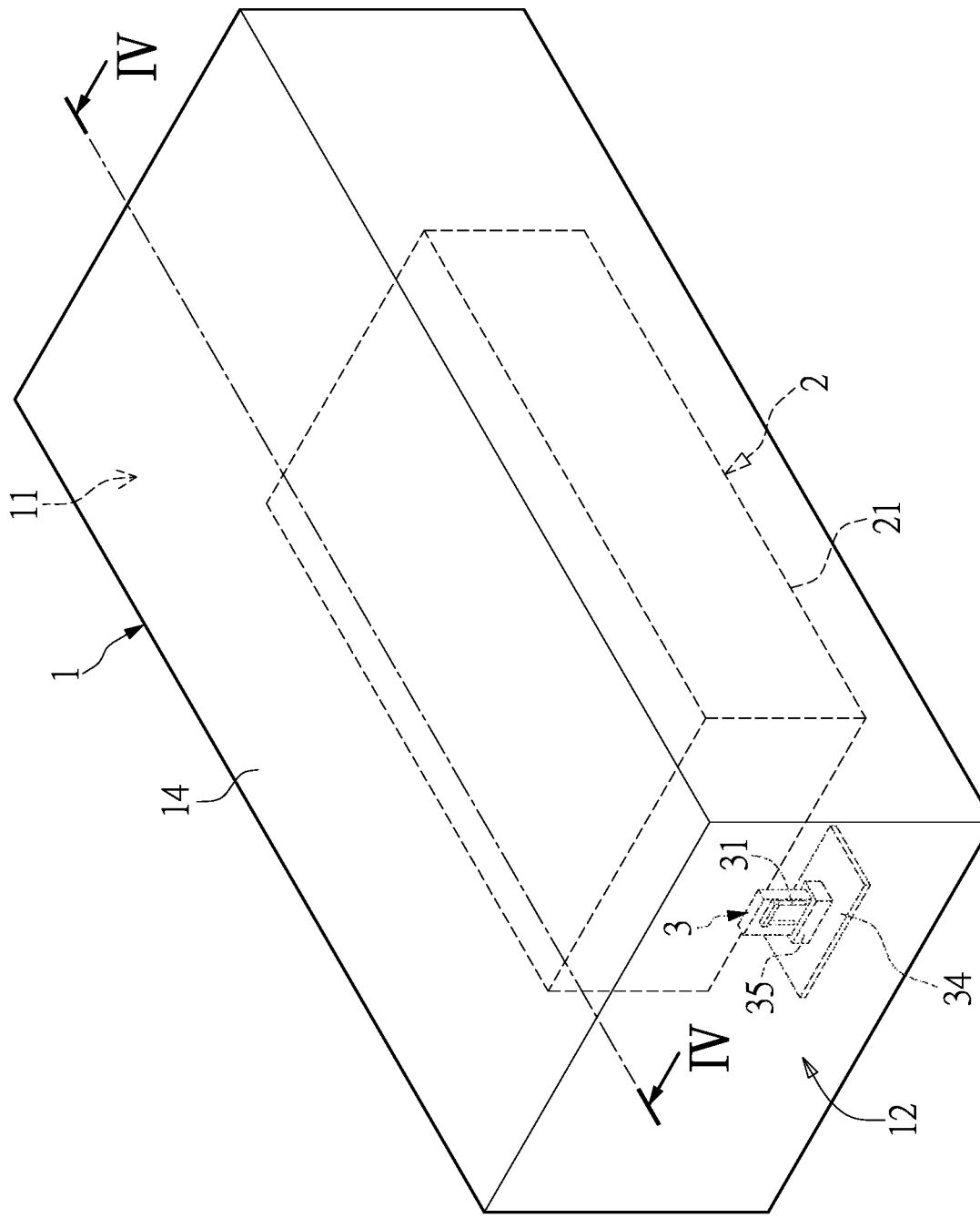
FIG. 3 is a schematic perspective view of the power conversion device having the temperature determination function according to a second embodiment of the present disclosure.
Figure 4:
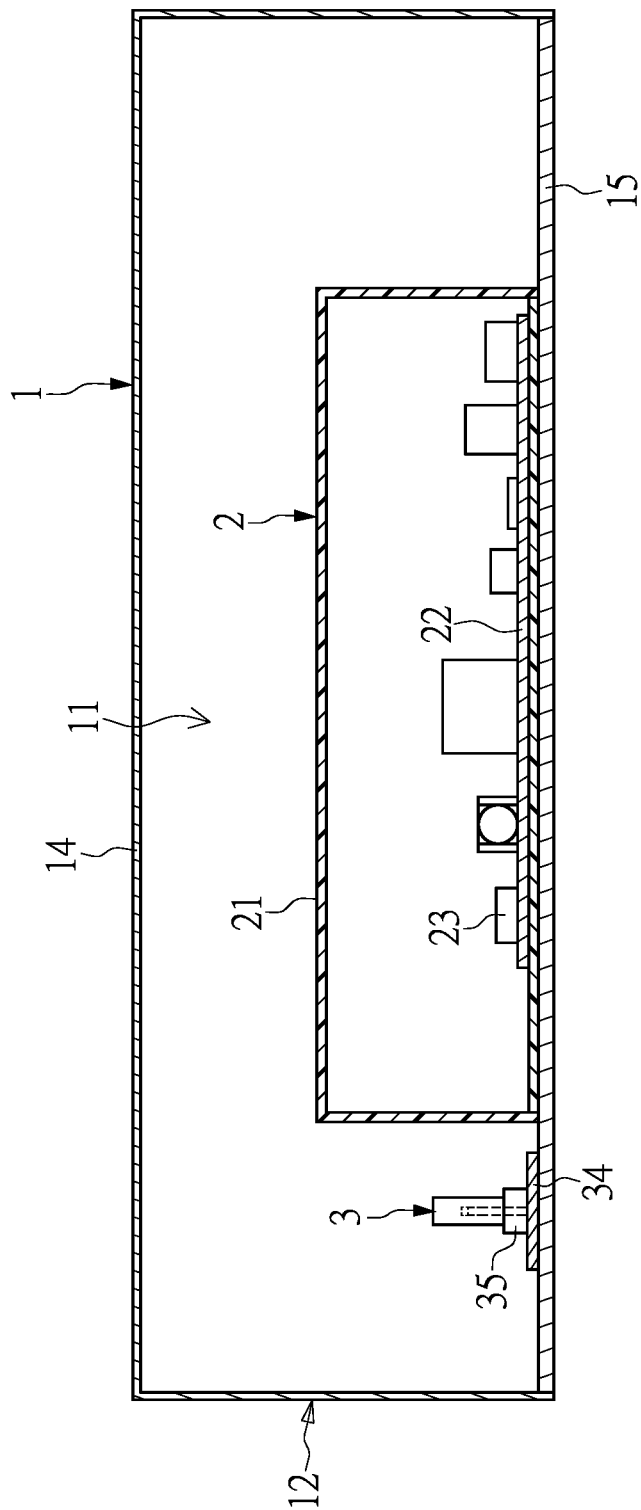
FIG. 4 is a cross-sectional view taken along line IV-IV of FIG. 3.

Reference is made to FIG. 3 and FIG. 4. In the present embodiment, the temperature determination component 3 is disposed within the accommodating space 11 of the housing 1, and is disposed on a circuit board 34. A connector 35 is disposed on the circuit board 34, and the pin 31 of the temperature determination component 3 is plugged into the connector 35, so that the temperature determination component 3 is disposed on the circuit board 34 via the connector 35. The pin 31 of the temperature determination component 3 can also be directly plugged onto the circuit board 34, so as to test the temperature determination component 3 through the circuit board 34. When the ambient temperature of the power converter 2 reaches the preset temperature, the temperature determination component 3 melts to indicate that the ambient temperature of the power converter 2 is abnormal. The temperature determination component 3 and the circuit board 34 are accessible via a connection wire (not shown). During testing, by opening the housing 1, the temperature determination component 3 and the circuit board 34 can also be accessible without the connection wire (not shown).

Third Embodiment

Figure 5:
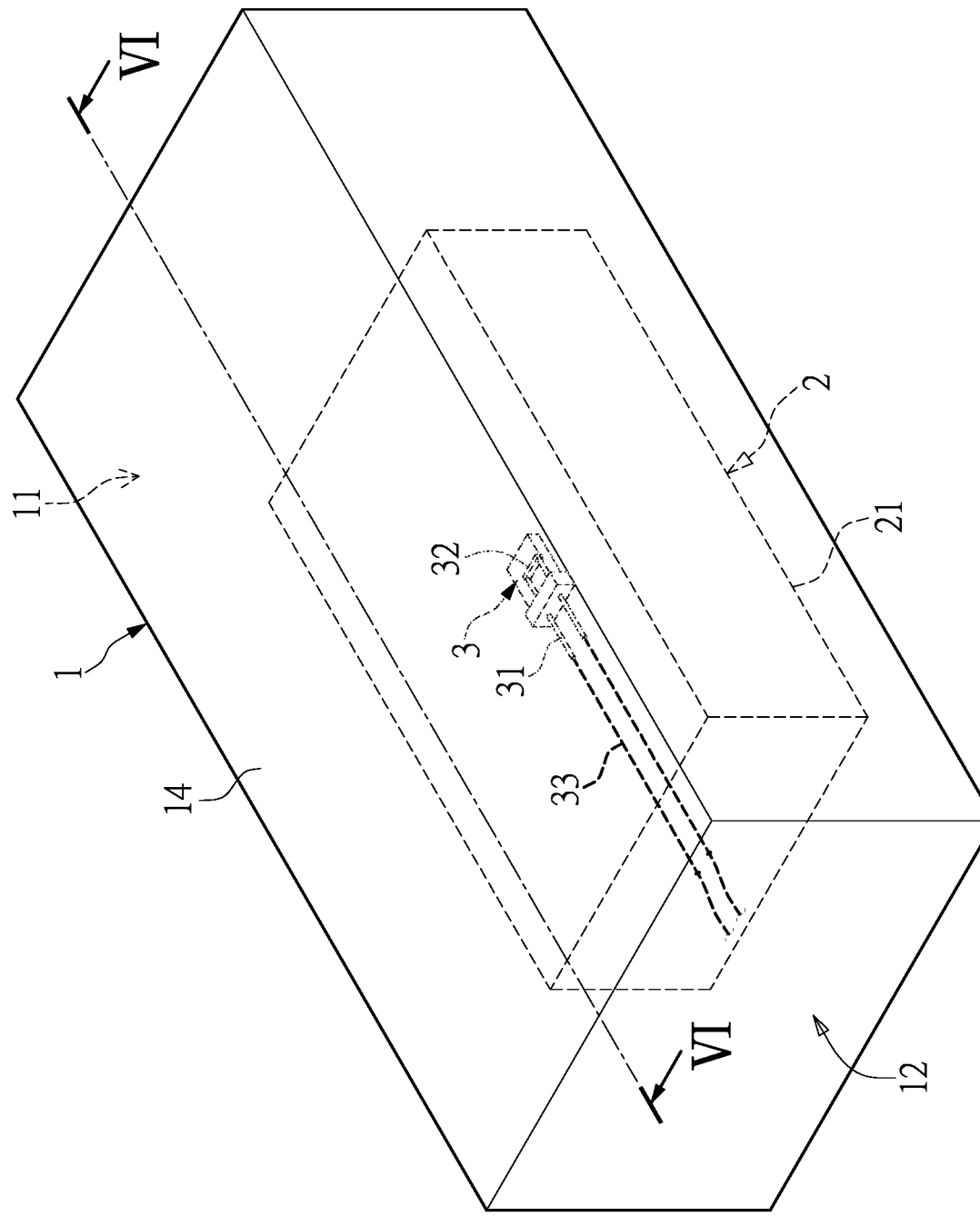
FIG. 5 is a schematic perspective view of the power conversion device having the temperature determination function according to a third embodiment of the present disclosure.
Figure 6:
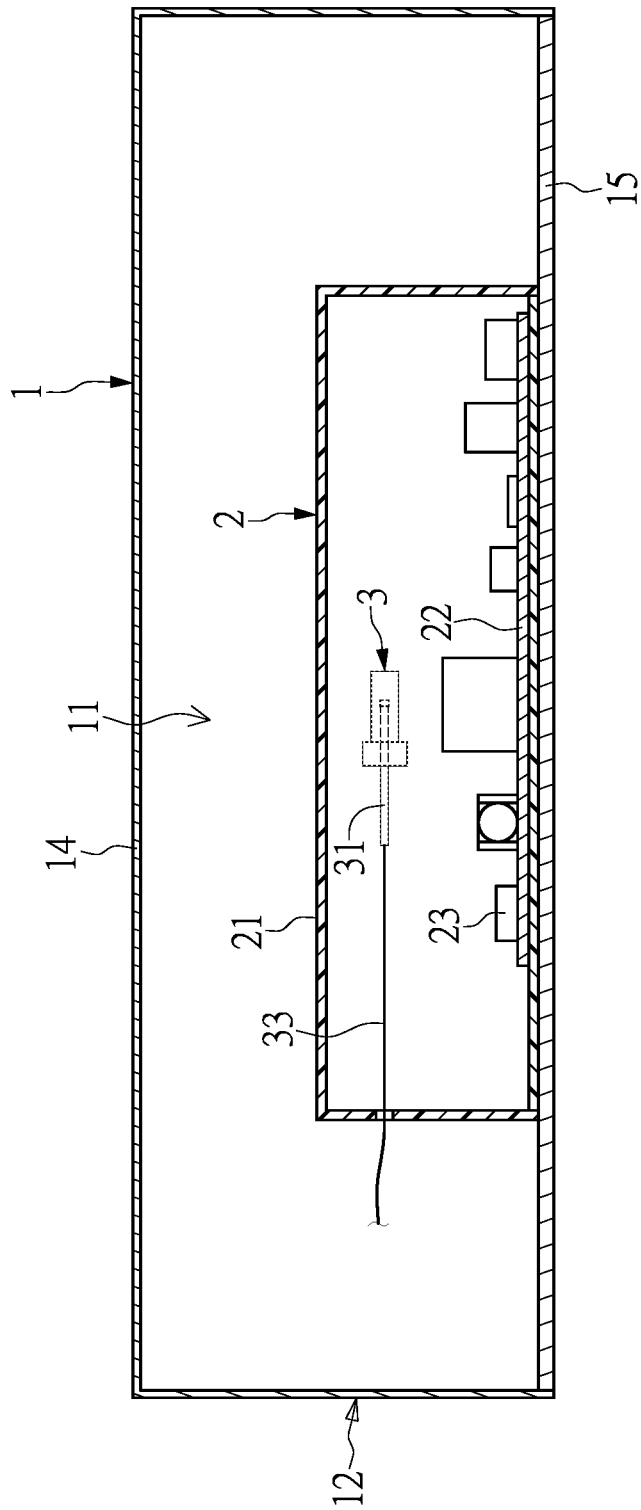
FIG. 6 is a cross-sectional view taken along line VI-VI of FIG. 5.

Reference is made to FIG. 5 and FIG. 6. In the present embodiment, the temperature determination component 3 is disposed within the power converter 2. That is, the temperature determination component 3 is disposed within the outer casing 21 of the power converter 2. The temperature determination component 3 has the pin 31, and the pin 31 is connected to the connection wire 33. The connection wire 33 extends outside of the outer casing 21, and can further extend outside of the housing 1. During testing, by opening the housing 1 and the outer casing 21, the temperature determination component 3 can also be accessible without the connection wire 33 (not shown). When the ambient temperature of the power converter 2 reaches the preset temperature, the temperature determination component 3 melts to indicate that the ambient temperature of the power converter 2 is abnormal. In the present embodiment, the preset temperature ranges between 50° C. and 150° C., and can be 50° C., 55° C., 60° C., 65° C., 70° C., 75° C., 80° C., 90° C., 100° C., 110° C., 120° C., 130° C., 140° C., or 150° C. In addition, the housing 1 of the present embodiment can be omitted, the temperature determination component 3 is disposed within the power converter 2, and the connection wire 33 connected to the pin 31 of the temperature determination component 3 can extend outside of the power converter 2.

Fourth Embodiment

Figure 7:
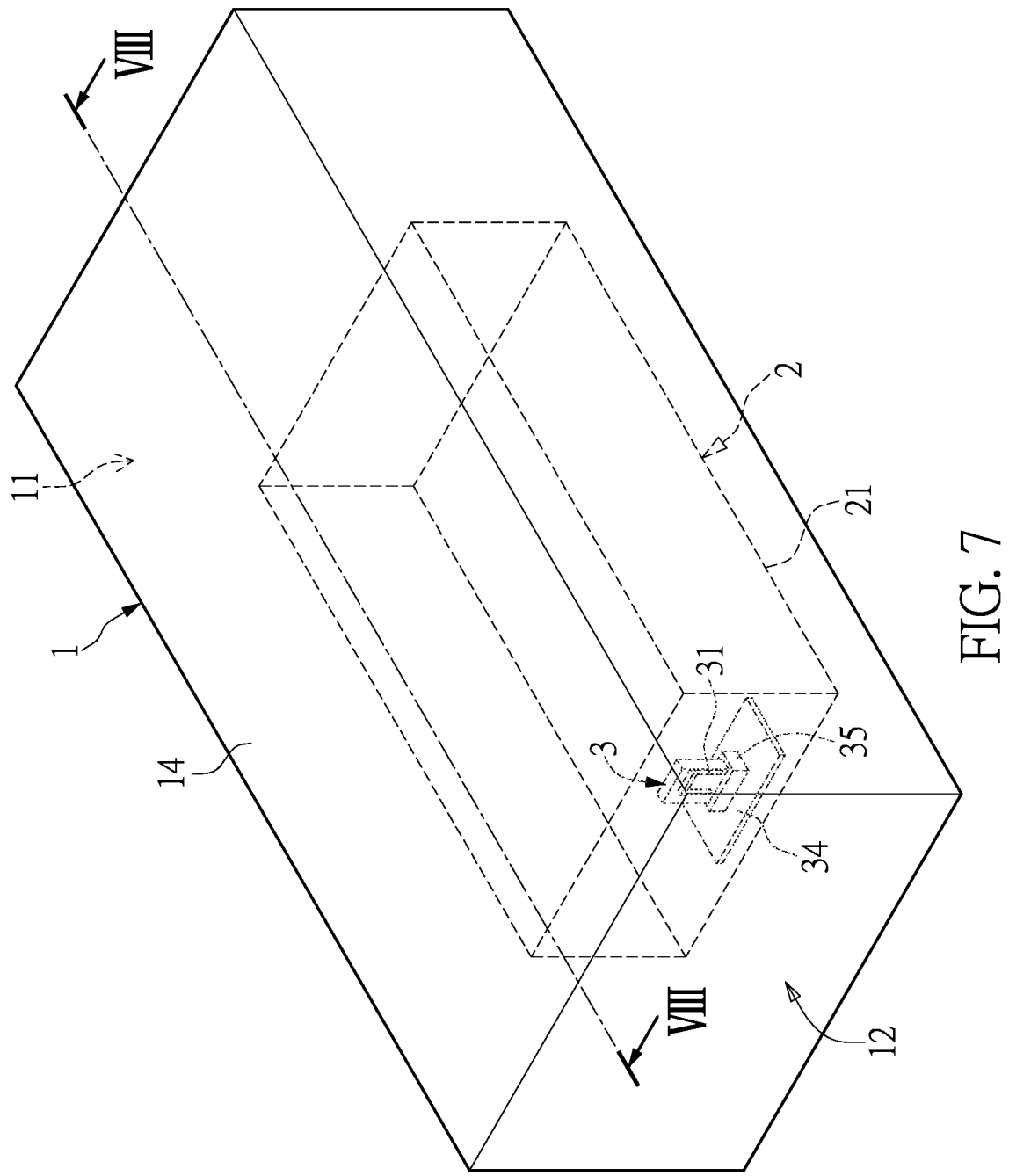
FIG. 7 is a schematic perspective view of the power conversion device having the temperature determination function according to a fourth embodiment of the present disclosure.
Figure 8:
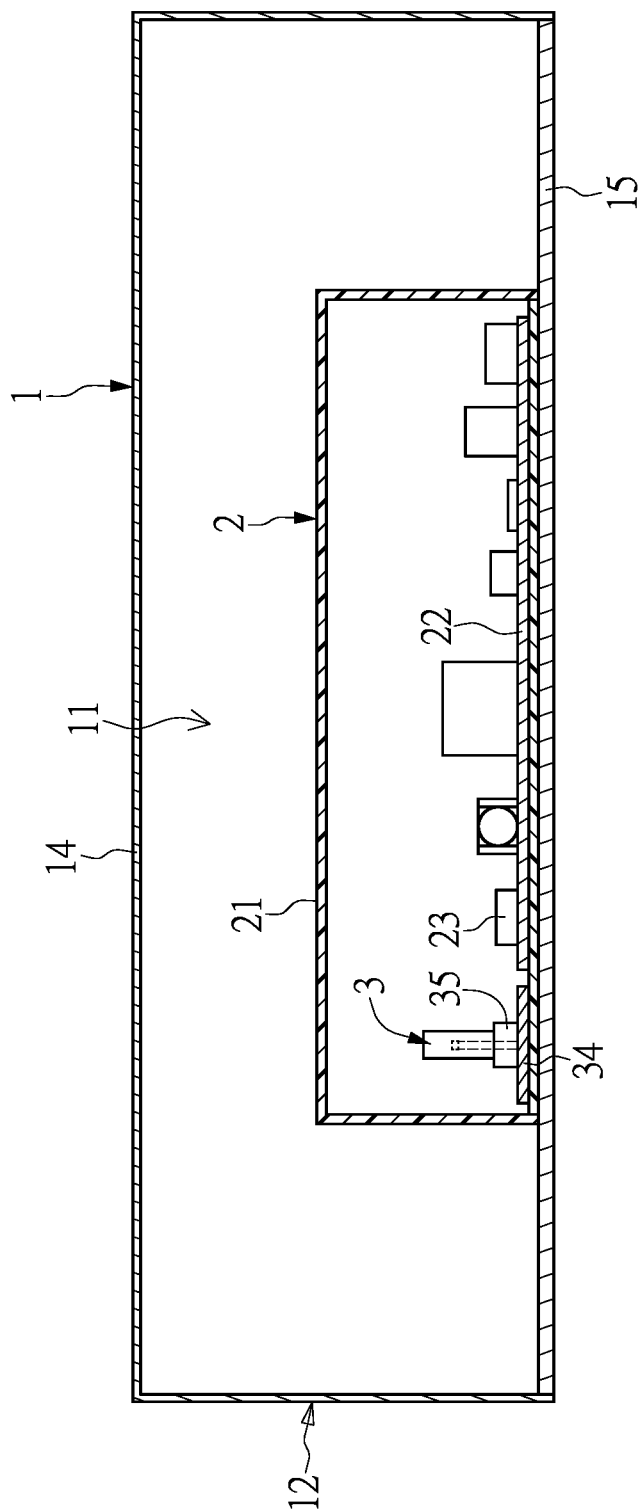
FIG. 8 is a cross-sectional view taken along line VIII-VIII of FIG. 7.

Reference is made to FIG. 7 and FIG. 8. In the present embodiment, the temperature determination component 3 is disposed within the power converter 2. That is, the temperature determination component 3 is disposed within the outer casing 21 of the power converter 2. The temperature determination component 3 is disposed on the circuit board 34. The circuit board 34 and the substrate 22 can be separately arranged, or the circuit board 34 can be integrally connected to the substrate 22. The temperature determination component 3 can be disposed on the circuit board 34 via the connector 35, or can be directly disposed on the circuit board 34. The temperature determination component 3 and the circuit board 34 are accessible via the connection wire (not shown). During testing, by opening the housing 1 and the outer casing 21, the temperature determination component 3 and the circuit board 34 can also be accessible without the connection wire (not shown). When the ambient temperature of the power converter 2 reaches the preset temperature, the temperature determination component 3 melts to indicate that the ambient temperature of the power converter 2 is abnormal.

Beneficial Effects of the Embodiments

In conclusion, the power conversion device having the temperature determination function provided by the present disclosure includes a power converter and at least one temperature determination component. When an ambient temperature of the power converter reaches the preset temperature, the temperature determination component melts to indicate that the power converter is used under the abnormal ambient temperature (i.e., the temperature being overly high). As such, the ambient temperature of the power converter can be determined based on melting of the temperature determination component. In this way, the ambient temperature of the power converter is monitored, and users can be warned, thereby improving operational safety of the power converter and the light fixture.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A power conversion device having a temperature determination function, comprising:
   a housing, wherein an accommodating space is formed inside the housing;
   a power converter disposed within the accommodating space of the housing, the power converter being a power conversion circuit for converting an alternating current to a direct current; and
   at least one temperature determination component disposed within the accommodating space of the housing, the at least one temperature determination component having no electrical connection and melting upon reaching a preset temperature;
   wherein, when an ambient temperature of the power converter reaches the preset temperature, the at least one temperature determination component melts to indicate that the ambient temperature of the power converter is abnormal.

2. The power conversion device according to claim 1, wherein the preset temperature of the at least one temperature determination component ranges between 50° C. and 150° C.

3. The power conversion device according to claim 1, wherein the power converter is applied to power conversion of an LED light fixture.

4. The power conversion device according to claim 1, wherein the housing includes an upper housing and a lower housing, the upper housing is disposed above the lower housing, the accommodating space is defined between the upper housing and the lower housing, and the upper housing is connected to the lower housing.

5. The power conversion device according to claim 1, wherein the at least one temperature determination component is a temperature fuse and has two pins, and a low melting point component is connected between respective ends of the two pins.

6. The power conversion device according to claim 1, wherein the at least one temperature determination component has a pin, the pin is connected to a connection wire, and the connection wire extends outside of the housing.

7. The power conversion device according to claim 1, wherein the at least one temperature determination component is disposed on a circuit board via a connector, or is directly disposed on the circuit board.

8. A power conversion device having a temperature determination function, comprising:
   a housing, wherein an accommodating space is formed inside the housing;
   a power converter disposed within the accommodating space of the housing, the power converter being a power conversion circuit for converting an alternating current to a direct current; and
   at least one temperature determination component disposed within the power converter, the at least one temperature determination component having no electrical connection and melting upon reaching a preset temperature;
   wherein, when an ambient temperature of the power converter reaches the preset temperature, the at least one temperature determination component melts to indicate that the ambient temperature of the power converter is abnormal.

9. The power conversion device according to claim 8, wherein the preset temperature of the at least one temperature determination component ranges between 50° C. and 150° C.

10. The power conversion device according to claim 8, wherein the power converter is applied to power conversion of an LED light fixture.

11. The power conversion device according to claim 8, wherein the housing includes an upper housing and a lower housing, the upper housing is disposed above the lower housing, the accommodating space is defined between the upper housing and the lower housing, and the upper housing is connected to the lower housing.

12. The power conversion device according to claim 8, wherein the at least one temperature determination component is a temperature fuse and has two pins, and a low melting point component is connected between respective ends of the two pins.

13. The power conversion device according to claim 8, wherein the at least one temperature determination component has a pin, the pin is connected to a connection wire, and the connection wire extends outside of the power converter and the housing.

14. The power conversion device according to claim 8, wherein the at least one temperature determination component is disposed on a circuit board via a connector, or is directly disposed on the circuit board.

15. A power conversion device having a temperature determination function, comprising:
   a power converter, the power converter being a power conversion circuit for converting an alternating current to a direct current; and
   at least one temperature determination component disposed within the power converter, the at least one temperature determination component having no electrical connection and melting upon reaching a preset temperature;
   wherein, when an ambient temperature of the power converter reaches the preset temperature, the at least one temperature determination component melts to indicate that the ambient temperature of the power converter is abnormal.

16. The power conversion device according to claim 15, wherein the preset temperature of the at least one temperature determination component ranges between 50° C. and 150° C.

17. The power conversion device according to claim 15, wherein the power converter is applied to power conversion of an LED light fixture.

18. The power conversion device according to claim 15, wherein the at least one temperature determination component is a temperature fuse and has two pins, and a low melting point component is connected between respective ends of the two pins.

19. The power conversion device according to claim 15, wherein the at least one temperature determination component has a pin, the pin is connected to a connection wire, and the connection wire extends outside of the power converter.

20. The power conversion device according to claim 15, wherein the at least one temperature determination component is disposed on a circuit board via a connector, or is directly disposed on the circuit board.

* * * * *